United States Patent
Taji

(10) Patent No.: US 10,862,276 B2
(45) Date of Patent: Dec. 8, 2020

(54) METHOD OF MANUFACTURING LIGHT EMITTING DEVICE AND LIGHT EMITTING DEVICE

(71) Applicant: NICHIA CORPORATION, Anan (JP)

(72) Inventor: Tomokazu Taji, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/116,856

(22) Filed: Aug. 29, 2018

(65) Prior Publication Data

US 2019/0067913 A1   Feb. 28, 2019

(30) Foreign Application Priority Data

Aug. 31, 2017 (JP) .................. 2017-167144
Aug. 23, 2018 (JP) .................. 2018-156001

(51) Int. Cl.
*H01S 5/40* (2006.01)
*H01S 5/00* (2006.01)
(Continued)

(52) U.S. Cl.
CPC ........ *H01S 5/4018* (2013.01); *G01R 31/2601* (2013.01); *G01R 31/2635* (2013.01); *G01R 31/44* (2013.01); *H01S 5/005* (2013.01); *H01S 5/0014* (2013.01); *H01S 5/02272* (2013.01); *H01S 5/02292* (2013.01);
(Continued)

(58) Field of Classification Search
CPC .... H01S 5/4018; H01S 5/02296; H01S 5/005; H01S 5/02272; H01S 5/02292; H01S 5/3013; H01S 5/0014; H01S 5/4031; H01S 5/0071; H01S 5/02208; H01S 5/02248;
(Continued)

(56) References Cited

U.S. PATENT DOCUMENTS 9,831,632 B2 * 11/2017 Horn .................. H01S 5/02208
2005/0242359 A1 11/2005 Yoshida et al.
(Continued)

FOREIGN PATENT DOCUMENTS

JP   H07-115250    5/1995
JP   2004-289010  10/2004
(Continued)

*Primary Examiner* — Yuanda Zhang
(74) *Attorney, Agent, or Firm* — Foley & Lardner LLP

(57) ABSTRACT

A method of manufacturing a light emitting device includes: providing a light emitting device in which a first and second semiconductor laser elements are connected in series; performing a first measurement that includes supplying current to the first semiconductor laser element to measure at least one property of the first semiconductor laser element, and supplying current to the second semiconductor laser element to measure at least one property of the second semiconductor laser element; supplying current to the first and second semiconductor laser elements for a length of time; performing a second measurement that includes supplying current to the first semiconductor laser element to measure the at least one property of the first semiconductor laser element, and supplying current to the second semiconductor laser element to measure the at least one property of the second semiconductor laser element, and evaluating the first and second semiconductor laser elements.

13 Claims, 7 Drawing Sheets

(51) Int. Cl.
  *H01S 5/30* (2006.01)
  *H01S 5/022* (2006.01)
  *G01R 31/44* (2020.01)
  *G01R 31/26* (2020.01)

(52) U.S. Cl.
  CPC ........ *H01S 5/02296* (2013.01); *H01S 5/3013* (2013.01); *H01S 5/0071* (2013.01); *H01S 5/02208* (2013.01); *H01S 5/02248* (2013.01); *H01S 5/02276* (2013.01); *H01S 5/4031* (2013.01)

(58) Field of Classification Search
  CPC ............ H01S 5/02276; G01R 31/2635; G01R 31/2601; G01R 31/44
  See application file for complete search history.

(56) References Cited

U.S. PATENT DOCUMENTS

| | | | |
|---|---|---|---|
| 2007/0091962 A1* | 4/2007 | Murakami | H01S 5/04254 372/50.124 |
| 2013/0088159 A1 | 4/2013 | Yano et al. | |
| 2015/0236472 A1 | 8/2015 | Ide et al. | |
| 2016/0341395 A1* | 11/2016 | Kiyota | H01S 5/4018 |

FOREIGN PATENT DOCUMENTS

| | | |
|---|---|---|
| JP | 2008-066322 A | 3/2008 |
| JP | 2010-147189 | 7/2010 |
| JP | 2013-080852 A | 5/2013 |
| JP | 2013-239614 A | 11/2013 |
| JP | 2014-190823 A | 10/2014 |
| JP | 2015-065302 A | 4/2015 |
| JP | 5705387 B1 | 4/2015 |
| JP | 2015-228401 A | 12/2015 |
| JP | 2016-518726 | 6/2016 |
| WO | WO-2014/183981 A1 | 11/2014 |

* cited by examiner

METHOD OF MANUFACTURING LIGHT EMITTING DEVICE AND LIGHT EMITTING DEVICE

CROSS-REFERENCE TO RELATED PATENT APPLICATION

The present application claims priority under 35 U. S. C. § 119 to Japanese Patent Application No. 2017-167144, filed on Aug. 31, 2017 and Japanese Patent Application No. 2018-156001, filed on Aug. 23, 2018, the contents of which are incorporated herein by reference in their entireties.

BACKGROUND

The present disclosure relates to a method of manufacturing a light emitting device and a light emitting device.

There has been known a light emitting device having a plurality of semiconductor laser elements mounted and connected in series (for example, see FIG. 4 of Japanese Publication No. 2016-518726 (with corresponding PCT Publication No. WO 2014/183981).

SUMMARY

When inspecting driving of the semiconductor laser elements included in such light emitting devices, each of the semiconductor laser elements may be inspected before being mounted, or a plurality of semiconductor laser elements that have been mounted and connected in series may be collectively inspected. However, results reflecting the mounted state of each semiconductor laser element cannot be obtained in the former case, whereas accurate detecting of minute degradation of each of the semiconductor laser elements is difficult in the latter case.

According to one embodiment of the present disclosure, a method of manufacturing a light emitting device includes, in this order: providing a light emitting device including, a base having a first wiring, a second wiring and a third wiring, and a first semiconductor laser element electrically connected to the first wiring and the second wiring, at an upper surface side of the base, in which the first semiconductor laser element and the second semiconductor laser element are connected in series; performing a first measurement by supplying electric current to the first semiconductor laser element through the first wiring and the second wiring to measure at least one property of the first semiconductor laser element, the at least one property of the first semiconductor element including at least an electrical property or an optical property, and supplying electric current to the second semiconductor laser element through the second wiring and the third wiring to measure at least one property of the second semiconductor laser element, the at least one property of the second semiconductor laser element including at least one of an electrical property or an optical property; supplying electric current to the first semiconductor laser element and the second semiconductor laser element for a length of time; performing a second measurement by supplying electric current to the first semiconductor laser element through the first wiring and the second wiring to measure the at least one property of the first semiconductor laser element, and supplying electric current to the second semiconductor laser element through the second wiring and the third wiring to measure the at least one property of the second semiconductor laser element; and evaluating the first semiconductor laser element based on the at least one property of the first semiconductor laser element measured during the first measurement and the second measurement, and evaluating the second semiconductor laser element based on the at least one property of the second semiconductor laser element measured during the first measurement and the second measurement.

A light emitting device according to one embodiment of the present disclosure includes: a base having a first wiring, a second wiring, and a third wiring; a first semiconductor laser element disposed at an upper surface side of the base and electrically connected to the first wiring and the second wiring; a second semiconductor laser element disposed at the upper surface side of the base and electrically connected to the second wiring and the third wiring; and a base cap being fixed to the base such that the first semiconductor laser element and the second semiconductor laser element are enclosed in a space defined by the base and the base cap. The first semiconductor laser element and the second semiconductor laser element are connected in series, and a portion of the first wiring, a portion of the second wiring, and a portion of the third wiring are respectively exposed at the upper surface of the base outside of the space defined by the base and the base cap.

The method of manufacturing as described above allows for individual inspection of each of the semiconductor laser element, and thus can realize a light emitting device of high reliability. The light emitting device described above can provide high reliability.

DETAILED DESCRIPTION

Certain embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation.

Figure 1:
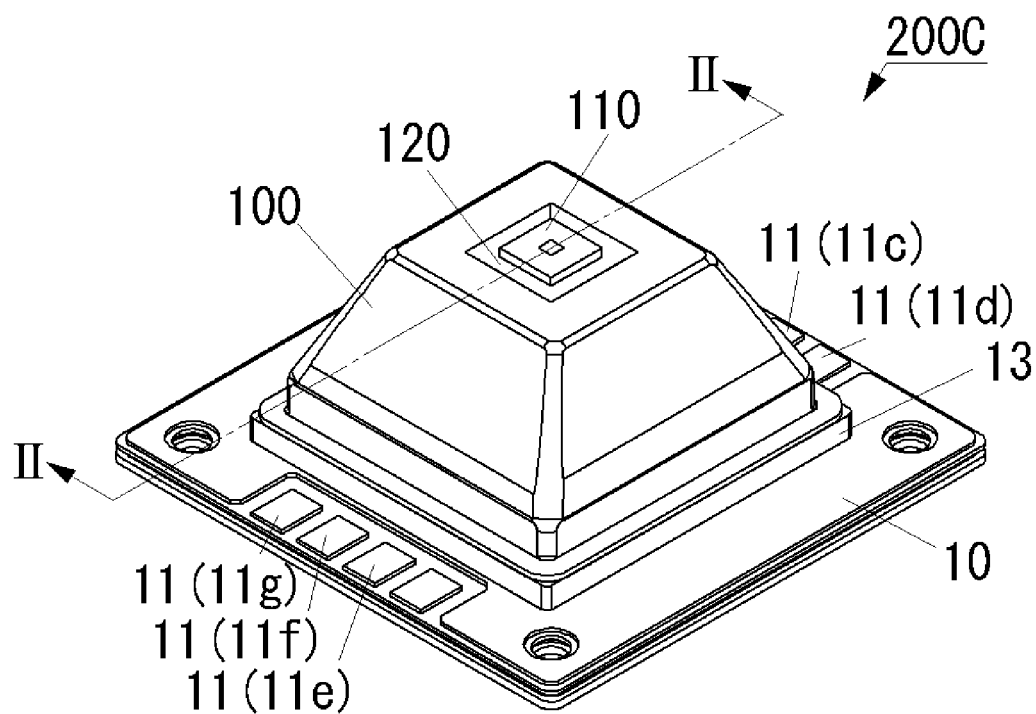
FIG. 1 is a schematic perspective view of a light emitting device according to a first embodiment of the present invention.
Figure 2:
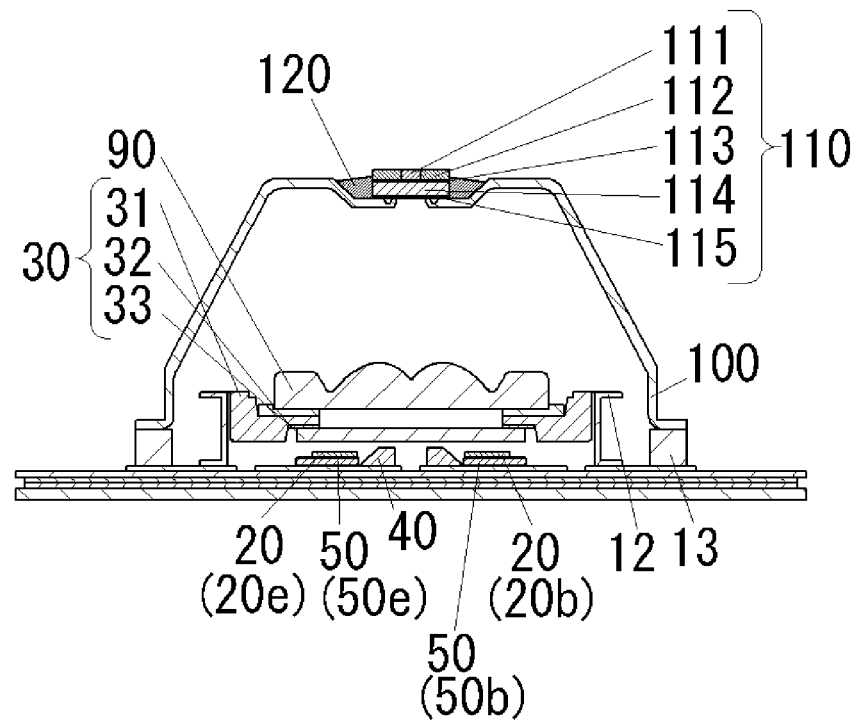
FIG. 2 is a schematic cross-sectional view taken along line II-II of FIG. 1.
Figure 3:
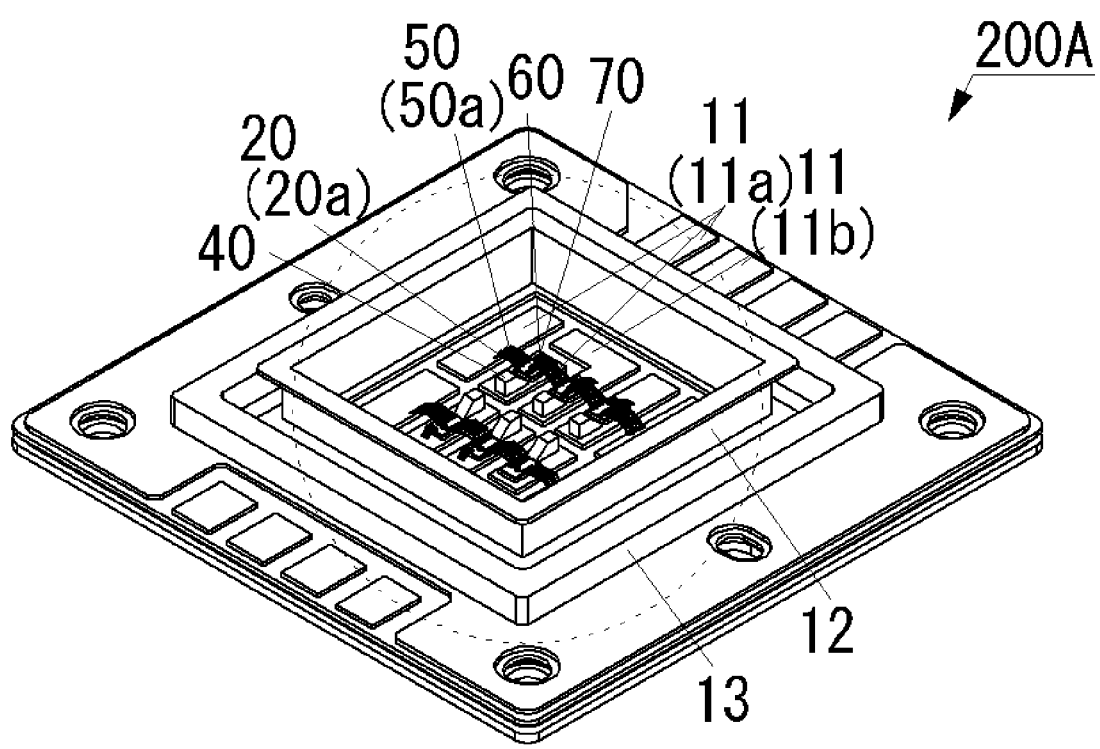
FIG. 3 is a schematic perspective view illustrating the light emitting device according to the first embodiment.
Figure 4:
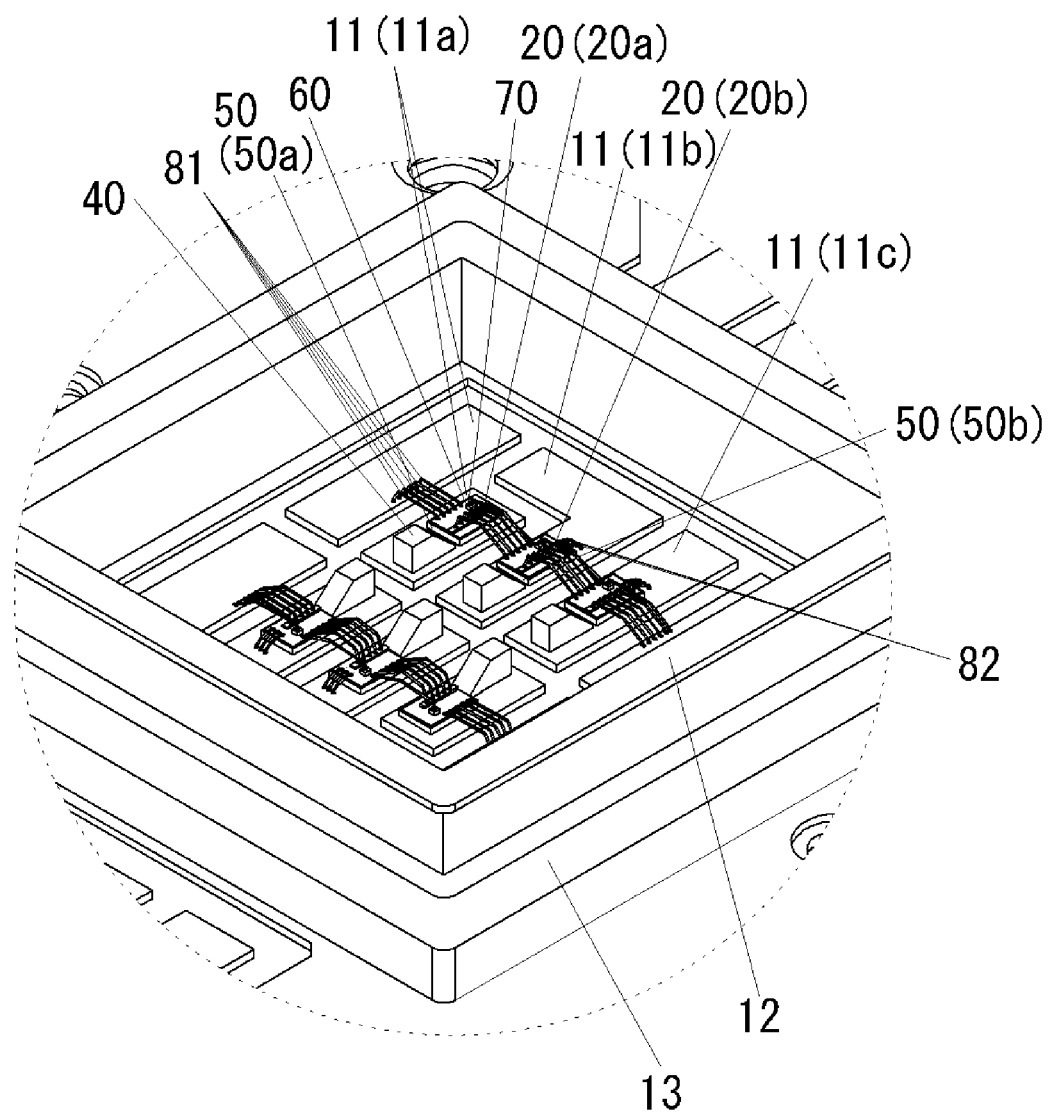
FIG. 4 is an enlarged view of the portion enclosed by the dotted line in FIG. 3.
Figure 5:
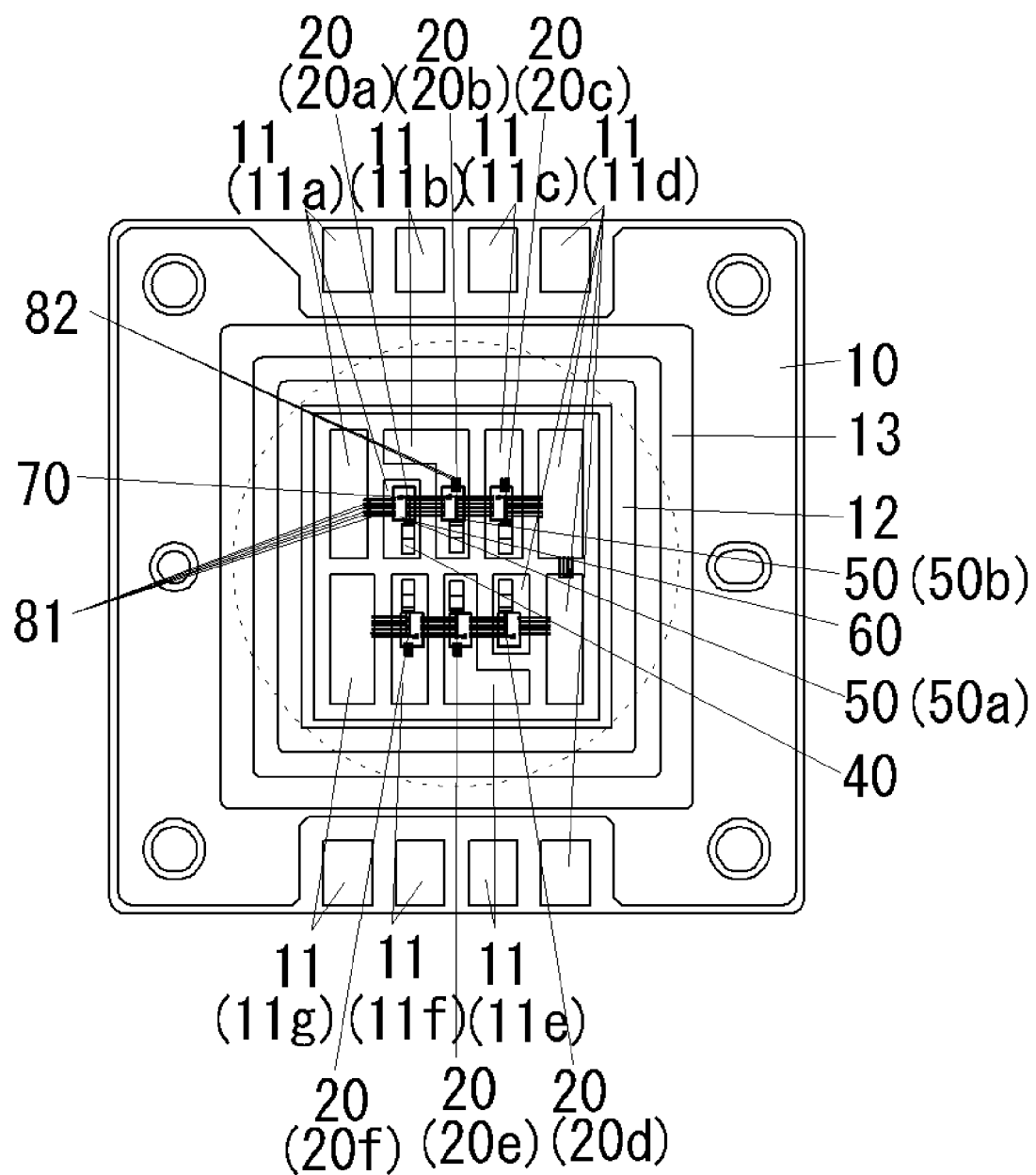
FIG. 5 is a top view illustrating a light emitting device according to the first embodiment.
Figure 6:
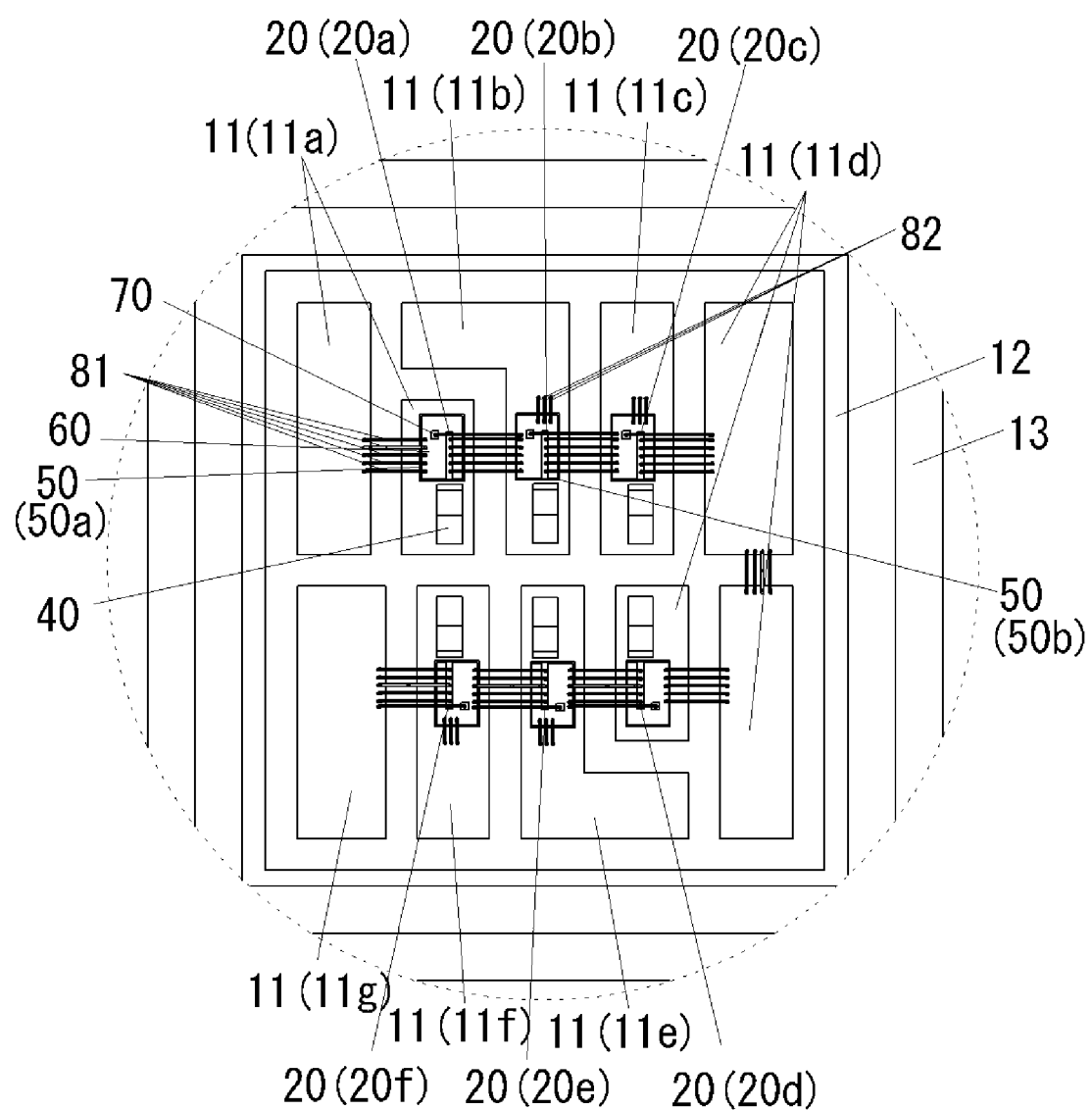
FIG. 6 is an enlarged view of the portion enclosed by the dotted line in FIG. 5.
Figure 7:
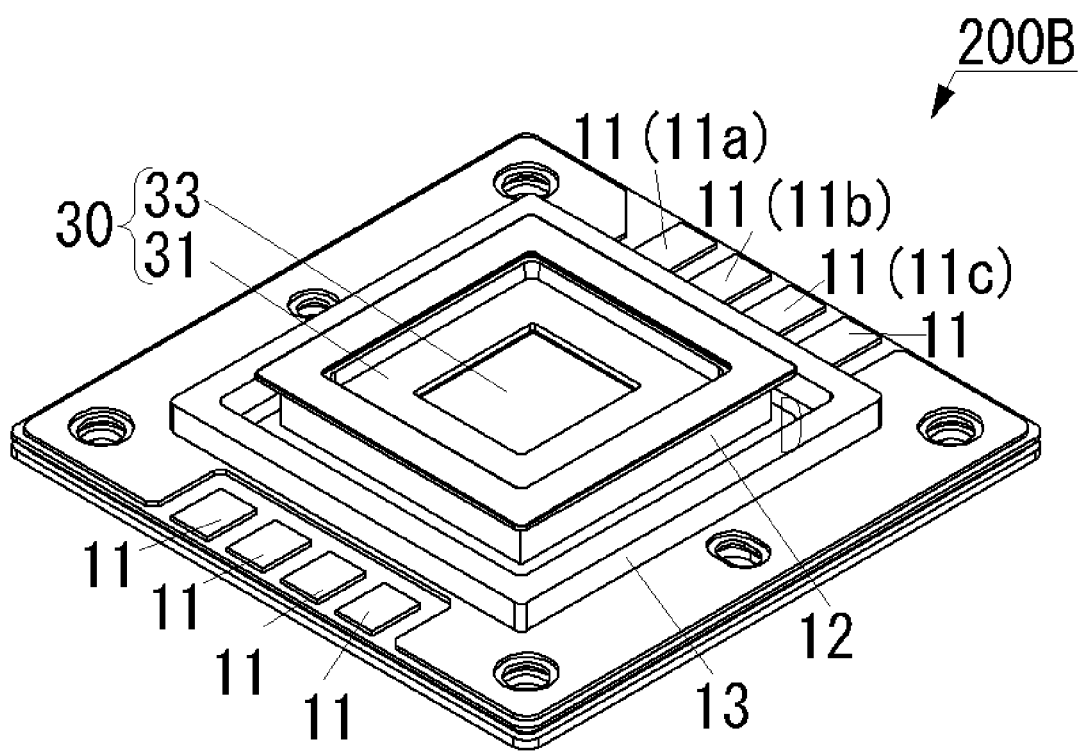
FIG. 7 is a schematic perspective view illustrating a light emitting device according to the first embodiment.

FIG. 1 is a schematic perspective view of a light emitting device 200C according to a first embodiment of the present invention, and FIG. 2 is a schematic cross-sectional view taken along line II-II of FIG. 1. FIG. 3 is a schematic perspective view illustrating a light emitting device 200A (i.e., a light source 200A), which shows a state of the light emitting device 200C in which the base cap 30 and the cover 100 have been removed. FIG. 4 is an enlarged view of the portion enclosed by the dotted line in FIG. 3. FIG. 5 is a top view of the light emitting device 200A, and FIG. 6 is an enlarged view of the portion enclosed by the dotted line in FIG. 5. FIG. 7 is a schematic perspective view illustrating a light emitting device 200B (i.e., a light source with base cap 200B), which shows a state in which the base cap 30 is fixed to the light emitting device 200A. In the present specification, for the simplicity of explanation, the term "light emitting device" refers to a light emitting device in which one or more semiconductor laser elements 20 (hereinafter may be referred to as "LD element(s)") are fixed on the base 10. That is, the light source 200A in which one or more LD elements 20 are fixed, the light source with base cap 200B in which the base cap 30 is fixed to the light source 200A, and the light emitting device 200C in which the cover 100 is fixed to the light source with base cap 200B, respectively, can serve as a "light emitting device", and therefore, may be collectively referred to as the "light emitting device 200".

A method of manufacturing a light emitting device 200 according to the first embodiment includes, in this order: providing a light emitting device including: a base 10 having a first wiring 11a, a second wiring 11b, and a third wiring 11c; a first LD element 20a being disposed at an upper surface side of the base 10 and electrically connected to the first wiring 11a and to the second wiring 11b, and a second LD element 20b being disposed at the upper surface side of the base 10 and electrically connected to the second wiring 11b and to the third wiring 11c; in which the first LD element 20a and the second LD element 20b are connected in series; performing a first measurement, including supplying electric current to the first LD element 20a through the first wiring 11a and the second wiring 11b and measuring at least one of an electric property or an optical property (hereinafter may be referred to as "first property") of the first LD element 20a, and supplying electric current to the second LD element 20b through the second wiring 11b and the third wiring 11c and measuring the first property of the second LD element 20a; supplying electric current to the first LD element 20a and the second LD element 20b for a certain length of time or longer; performing a second measurement, including supplying electric current to the first LD element 20a through the first wiring 11a and the second wiring 11b and measuring the first property of the first LD element 20a, and supplying electric current to the second LD element 20b through the second wiring 11b and the third wiring 11c and measuring the first property of the second LD element 20b; and respectively evaluating the first LD element 20a and the second LD element 20b based on the first property of the first LD element 20a from the first measurement and the first property of the first LD element 20a from the second measurement, and on the first property of the second LD element 20b from the first measurement and the first property of the second LD element 20b from the second measurement.

The method of manufacturing described above allows for individual inspection of properties of the first LD element 20a and the second LD element 20b each in an operating state as a light emitting device (i.e., in a state in which each LD element 20 is mounted on the base 10), which allows obtaining of a light emitting device of high reliability. More details thereof will be described below.

Because the same electric current can be supplied to each of the components connected in series, in a light emitting device having two or more LD elements, the two or more LD elements may be connected in series. Inspection of properties of each LD element in such a light emitting device may be carried out on individual LD elements before mounting the LD elements, or collectively on the entire two or more LD elements, after mounting each of the two or more LD elements and connecting them in series. However, the former way of inspection is not capable of detecting degradation of the properties of the LD elements due to improper mounting or the like. In the latter way of inspection, although apparent degradation of the properties can be detected, minute degradation of each of the LD elements cannot be detected. The latter way of inspection will be more specifically described below. For inspecting presence or absence of improper application or the like of the bonding material located between each LD element and the base, an inspection for aging effects can be effective, in which a current higher than the LD element was designed to use is kept applied for a relatively long length of time and a change before and after applying the current is inspected. However, in the case in which two LD elements are connected in series, when one of the two LD elements has insufficient heat dissipation and exhibits a lower forward voltage (hereinafter may be referred to as "Vf") after the aging when compared to the Vf before the aging, and the other one of the two LD element has sufficient heat dissipation and exhibits a higher Vf after the aging when compared to the Vf before the aging, such an individual deficiency may not be detected when the LD elements connected in series are collectively inspected.

Accordingly, in the present embodiment, in the light emitting device 200 that includes two or more LD elements 20 connected in series, the first property of each of the LD elements, for example, the first LD element 20a and the second LD element 20b, are individually inspected using the first wiring 11a, the second wiring 11b, and the third wiring 11c. Thus, individual inspection on each of the LD elements 20 can realize checking of properties of each of the LD elements, which allows for obtaining light emitting devices with high reliability. For example, light emitting devices in vehicular lighting are required to exhibit little change in the properties for a long length of time. Accordingly, the light emitting devices according to the present embodiment are particularly suitable to the use in vehicular lighting etc.

Figure 8:
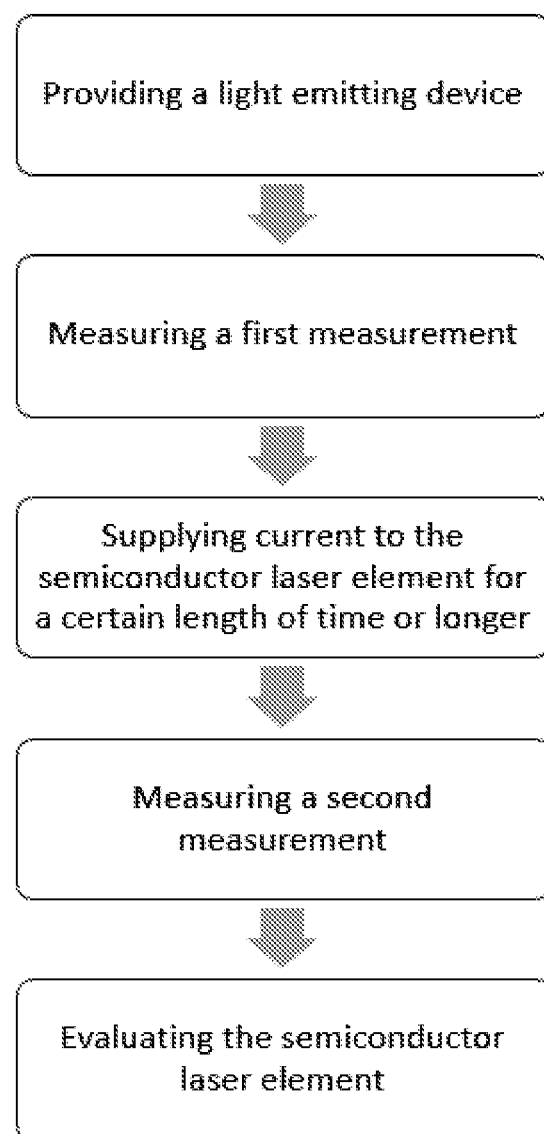
FIG. 8 is a flowchart illustrating a method of manufacturing a light emitting device according to the first embodiment.

In the below, a method of manufacturing a light emitting device 200 will be described with reference to the process flow chart shown in FIG. 8.

Providing Light Emitting Device

The light emitting device 200 is provided. In the present embodiment, first, the light emitting device 200A shown in FIG. 3 to FIG. 0.6 is provided. The first light emitting device 200A includes a base 10 having a first wiring 11a, a second wiring 11b, and a third wiring 11c, a first LD element 20a disposed on an upper surface of the first wiring 11a and being electrically connected to the first wiring 11a and the second wiring 11b, and a second LD element 20b disposed on an upper surface of the second wiring 11b and being electrically connected to the second wiring 11b and the third wiring 11c. The first LD element 20a and the second LD element 20b are connected in series.

The base 10 includes at least three wirings 11a to 11c. In the first embodiment, seven wirings 11a to 11g are included. The base 10 has a layered structure containing a plurality of insulating layers. The first wiring 11a serves as a part of the upper surface of the base 10 located inward of the first frame 12 and a part of the upper surface of the base 10 located outward of the first frame 12. The portion of the first wiring 11a located inward of the first frame 12 and the part of the first wiring 11a located outward of the first frame 12 are electrically connected by a part of the first wiring 11a located inside the base 10. Examples of the materials for the insulating layers include AN, $Si_3N4$, SiC, $ZrO_2$, $Al_2O_3$, and sapphire, and examples of the materials for the wiring 11 include Cu and Au. Other components of the wiring 11, the second wiring 11b and successive wirings, can also have configurations similar to that of the first wiring 11a.

The first wiring 11a is used for the measurement of the properties of the first LD element 20a and for driving a plurality of LD elements 20 that are connected in series. That is, the first wiring 11a is a common wiring that is used at the time of individually driving the first LD element 20a for the measurement and also at the time of driving the first LD element 20a together with other LD elements 20. With this configuration, the number of wirings can be reduced, which allows for employing a base of simpler structure. In the present embodiment, the seventh wiring 11g is also used as a common wiring line. In the present embodiment, the first wiring 11a includes two wiring parts inward of the first frame 12. The first sub-mount 50a mounted with the first LD element 20a is disposed on one of the two first wiring parts, and the other of the two first wiring parts is directly connected to the first wiring part 11a located outward of the first frame 12. The other of the two first wiring parts and the first sub-mount 50a are connected by the first wires 81. The first wiring 11a may be formed with a single wiring part as in the second wiring 11b. The fourth wiring 11d includes three wiring parts inward of the first frame 12, but the fourth wiring 11d may be formed with a single wiring part as in the first wiring 11a.

The base 10 includes the first frame 12 surrounding two or more LD elements 20. The first frame 12 can be connected by way of welding, for example. When welding is used, the first frame 12 is preferably made of a material that contains Fe as its main component. Other examples of the materials of the first frame 12 include a single body of Cu, Al, Fe, Au, or Ag, and an alloy of those.

The base 10 further includes a second frame 13 surrounding the first frame 12. The second frame 13 can be connected by using a brazing material, for example. Examples of the materials of the second frame 13 include a single body of Cu, Al, Fe, Au, or Ag, and an alloy of those.

On the upper surface of the base 10 inward of the first frame 12, two or more sub-mounts 50 are arranged and a single LD element 20 is mounted on each of the sub-mounts 50. More specifically, the first LD element 20a is disposed on the upper surface of the first wiring 11a via the first sub-mount 50a, and the second LD element 20b is disposed on the upper surface of the second wiring 11b via the second sub-mount 50b. In a similar manner, other LD elements 20 such as the third LD element are disposed on the upper surfaces of the wirings 11 such as the third wiring 11c via the sub-mounts 50 such as the third sub-mount 50c, respectively. In the present embodiment, each of the LD elements 20 is fixed on the corresponding sub-mount 50 via an electrically conductive layer 60 made of, for example, Au—Sn. The LD elements 20 are connected in series by the first wires (thin metal wires) 81.

The LD elements 20 are configured to emit laser light as excitation light to excite a fluorescent material contained in the fluorescent part 111. The light emitted from the LD elements 20 preferably have a peak wavelength in a range of 320 nm to 530 nm, more preferably in a range of 430 nm to 480 nm. For such LD elements 20, LD elements that include a nitride semiconductor can be employed. It is preferable to use the LD elements 20 whose first property have already been inspected before mounting on the base 10. With this arrangement, deficiency caused by the properties of the LD elements 20 can be reduced.

In the present embodiment, all the LD elements 20 arranged inward of the first frame 12 are connected in series. Accordingly, a certain amount of current can be supplied equally to each of the LD elements 20, and thus, variation in the emission intensity among the LD elements 20 can be reduced. The LD elements 20 may be connected such that some of the LD elements 20 are connected in series and the rest of the LD elements 20 are connected in series, thus two or more groups of the LD elements each connected in series may be provided.

The sub-mounts 50 preferably have a thermal expansion coefficient between the thermal expansion coefficient of the base 10 and the thermal expansion coefficient of the LD elements 20. Accordingly, detachment of the LD elements 20 and/or detachment of the sub-mounts 50 can be reduced. When a material containing a nitride semiconductor is used for the LD elements 20, aluminum nitride or silicon carbide can be used for the sub-mounts 50. In the present embodiment, the second and subsequent sub-mounts 50b to 50f each has a configuration similar to that of the first sub-mount 50a, but all the sub-mounts may have different configurations.

Each of the sub-mounts 50 is fixed to the base 10 by using the method described below. The first laser device having the first LD element 20a mounted on the first sub-mount 50a and the second laser device having the second LD element 20b mounted on the second sub-mount 50b are respectively mounted on the upper surface of the base 10 via a bonding material containing nano-metal particles or sub-micron metal particles and an organic solvent. The first laser device is mounted on the first wiring 11a and the second laser device is mounted on the second wiring 11b. Subsequently, the bonding material is heated to bond the first laser device and the second laser device to the base 10 at once. At this time, application of uniform pressure to all the laser devices is difficult due to variation of heights of the laser devices. Thus, the first laser device and the second laser devices are bonded to the base 10 without pressing the devices onto the base 10. With the use of this method, a plurality of laser devices can be fixed to the base 10 at once without applying an excessive heat on the bonding material. Thus, this method is suitable for fixing a plurality of laser devices, but may create uneven mounting states. For example, if a gap is created between the laser device and the base, heat generated from the LD elements 20 may be difficult to disperse, which may accelerate degradation of the LD elements 20. The method of manufacturing according to the present embodiment allows inspection of the laser devices in their mounted state, which allows evaluation of properties of each of the LD elements 20 taking into consideration the mounting state of the laser device.

The first sub-mount 50a and the base 10, and the second sub-mount 50b and the base 10 are respectively bonded by nano-metal particles or sub-micron metal particles. In the present embodiment, sub-micron gold particles are used. In the present disclosure, the term "nano-metal particles" refers to metal particles having an average particle size in a range of 1 nm to 100 nm, and the term "sub-micron metal particles" refers to metal particles having an average particle size in a range of 101 nm to 1 μm. Average particle size can be determined, for example, by using a projected image produced by a transmission electron microscope (TEM), randomly measuring projected area circle equivalent diameters of 100 nano-metal particles or metal sub-micron particles, and calculating the average value.

In order to prevent damage on the LD elements 20, a protective element 70 such as Zener diode may be provided on each sub-mount 50. Each of the protective elements 70 is electrically connected to the LD elements 20 via a wire.

The second wiring 11b and the second sub-mount 50b are connected by the second wires 82 (hereinafter, a wire (or wires) used in series connection may be referred to as a "first wire 81 (or first wires 81)" and other wires may be referred to as "second wire(s) 82"). Thus, it is possible to individually drive the first semiconductor laser element 20a and the second semiconductor laser element 20b, for example, for individually measuring the first property of the first semiconductor laser element 20a and the second semiconductor laser element 20b.

The second sub-mount 50b and the second wiring 11b are connected by a plurality of second wires 82. The number of the first wires 81 is preferably greater than the number of the second wires 82. The lengths of the second wires 82 are preferably shorter than the lengths of the first wires 81. For example, the length of one of the second wires 82 is preferably shorter than the length of one of the first wires 81. This is because the second wires 82 are highly unlikely to be employed in the actual driving of the light emitting device and therefore it is enough for the second wires 82 to have numbers and lengths that are sufficient to supply electric current for performing the first measurement and the second measurement. The same can be applied to the second wires 82 that connect third and subsequent sub-mounts 50 and the third and subsequent wirings 11c to 11g respectively.

The light-reflecting parts 40 are disposed on an upper surface side of the base 10 via the wirings. The light-reflecting parts 40 are configured to reflect the light from their corresponding LD elements 20 upward. For example, a mirror having at least a portion of its surface formed with a reflecting film such as a dielectric multilayer film can be used as the light-reflecting parts 40. As shown in FIG. 3 and FIG. 4, a single light-reflecting part 40 can be provided for a single LD element 20.

In the present embodiment, the first measurement is performed in a state of the light emitting device 200B shown in FIG. 7. In the light emitting device 200B, the base cap 30 is fixed to the base 10 to make the space (hereinafter referred to as "space S") confining the first LD element 20a and the second LD element 20b hermetically sealed. The first measurement may be performed on the light emitting device 200A in which the base cap 30 has not been provided. In the light emitting device 200B, a portion of the first wiring 11a, a portion of the second wiring 11b, and a portion of the third wiring 11c are exposed on the upper surface of the base 10 at locations outside of the space S. The LD elements 20 that include a nitride semiconductor have a high energy density in the light emission surfaces, which tend to attract dust such as an organic material to their light emission end surfaces. With hermetically sealing the space S, attracting of dust to the light emission surfaces of the LD elements 20 can be reduced.

The base cap 30 includes a support 31, a first light-transmissive part 33 held by a lower surface of the support 31, and an adhesive member 32 bonding the support 31 and the first light-transmissive part 33. The support 31 is connected to the first frame 12 by welding or the like. The support 31 defines a through-opening to allow light from the LDs to pass through. The first light-transmissive part 33 is fixed to cover the through-opening of the support 31. The support 31 is preferably made of a material that contains Fe as its main component. Other examples of the materials of the support 31 include a single body of Cu, Al, Fe, Au, or Ag, and an alloy of those. The first light-transmissive part 33 can be formed with glass, sapphire, or the like. The first light-transmissive part 33 can have a thickness in a range of, for example, 0.1 mm to 2 mm.

In the present embodiment, the space S is defined by the base 10, the first frame 12, and the base cap 30. Alternatively, the space S may be defined by a plate-shaped base and a cover 30 that is formed with a downward opening recess. In other words, the base cap 30 may be disposed on the upper surface of the base such that a plurality of LD elements can be disposed in the recess.

Performing a First Measurement

Next, the first property of the first LD element 20a is measured by supplying electric current to the first LD element 20a through the first wiring 10a and the second wiring 11b, and the first property of the second LD element 20b is measured by supplying electric current to the second LD element 20b through the second wiring 11b and the third wiring 11c. Hereinafter, the performance of the first measurement may also be referred to as "the first measuring step," and the performance of the second measurement may also be referred to as "the second measuring step." In the first measuring step, the same first property is measured on the first LD element 20a and the second LD element 20b. In the first measuring step, electric current is supplied for a relatively short time at a value higher than its designated value for use in driving the light emitting device. The third and subsequent LD elements 20c to 20f are also supplied with the electric current in the same manner to measure the first property.

The method of measuring the first property of each of the LD elements 20 will be described below with reference to FIG. 5. The first property of the first LD element 20a is measured with supplying electric current to the first wiring 11a located outside of the first frame 12 and to the second wiring 11b located outside of the first frame 12. The electric current from the first wiring 11a flows through the wiring part, the first wire 81, the electrically conductive layer 60 on the first sub-mount 50a, the first LD element 20a, the first wire 81, the electrically conductive layer 60 on the second sub-mount 50b, the second wire 82, and the second wiring 11b, in this order. With this arrangement, only the first LD element 20a emits light. In this first measuring step, for example, the value of the electric current is gradually increased from 0 A to 4 A in four seconds, while continuously measuring the first property. Next, the first property of the second LD element 20b is measured. The measuring of the first property of the second LD element 20b is carried out in the same manner with supplying electric current to the second wiring 11b and the third wiring 11c. The measuring of the first property of each of the third and subsequent LD elements 20 is also carried out in the same manner.

In the present disclosure, the term "electrical property" refers, for example, to Vf and the term "optical property" refers, for example, to at least one of far field pattern (FFP), wavelength, and light output. In the first measuring step, at least Vf is preferably measured, and at least Vf and FFP are more preferably measured. When all of the plurality of LD elements that are connected in series are turned ON to emit light and are collectively measured, properties of individual LD elements 20 cannot be determined, but as in the present embodiment, individually measuring each one of the plurality of LD elements 20 allows for determining properties of each LED element, and thus evaluation of each of the plurality of LD elements can be facilitated.

In the first measuring step, in view of attracting dust to the LD elements 20, each measurement is preferably carried out in the state of the light emitting device 200B. When the measuring at the first time is carried out in the state of the light emitting device 200A, the cap is fixed to the base to obtain the state of the light emitting device 200B between the first measuring step and a step of supplying electrical current for a certain length of time or longer.

Supplying Electric Current for Certain Length of Time or Longer

Next, electric current is supplied to each LD element 20 for a certain length of time or longer. In this step, electric current greater than threshold current is supplied to all the LD elements 20 mounted on the base 10 for a certain length of time. As described above, with supplying a relatively high electric current for a certain length of time or longer, inspection of time-depending change of each of the LD elements 20 can be facilitated to be done relatively shorter. The length of time to supply electric current can be changed according to the value of the electric current to be supplied. For example, a length in a range of 1 hour to 20 hours is preferable, and a range of 5 hours to 15 hours is more preferable. Supplying the electric current for equal to or longer than the minimum length of time shown above allows for facilitating detection of initial defectiveness of the LD elements, and supplying the electric current for equal to or shorter than the maximum length of time shown above allows for reducing degradation of the LD elements. For example, in an ambient temperature surrounding the light emitting device of 20° C., a pulse current of 14 A is applied for about 9.5 hours.

In the present embodiment, the electric current is supplied to the first LD element 20a and the second LD element 20b that are connected in series. In other words, the electric current is supplied to all the LD elements 20 by using the first wires 81. With this arrangement, the electric current can be supplied collectively to the plurality of LD elements 20, and thus time-depending changes of all the LD elements can be determined in a short length of time. In the first measuring step, alternatively, the electric current can be supplied to each of the LD elements through the second wires 82 connected to the sub-mount 50 and the wiring 11.

Performing a Second Measurement

Next, the first property of each of the LD elements 20 are measured in a similar manner as in the first measuring step. Specifically, the first property of the first LD element 20a is measured by supplying electric current to the first LD element 20a through the first wiring 10a and the second wiring 11b, and the first property of the second LD element 20b is measured by supplying electric current to the second LD element 20b through the second wiring 11b and the third wiring 11c.

Evaluating Semiconductor Laser Element

Next, each of the LD elements 20 are evaluated based on the first property determined by the first measuring step and the first property determined by the second measuring step. More specifically, each of the LD elements 20 are evaluated such that the first LD element 20a is evaluated based on the first property of the first LD element 20a determined by the first measuring step and the first property of the first LD element 20a determined by the second measuring step, and the second LD element 20b is evaluated based on the first property of the second LD element 20b determined by the first measuring step and the first property of the second LD element 20b determined by the second measuring step.

For example, presence of a defect in the bonding between the LD element 20 and the wiring 11 results in a lower Vf value obtained by the second measuring step than a Vf value obtained by the first measuring step. This is thought to be due to high temperature of the LD elements 20 caused by a defect in the bonding that impedes dissipation of heat generated by the LD elements to the base 10, which increases the temperature of the LD elements. If the LD elements are driven in this state, the amount of the electric current increases and that further increases the amount of heat generated from the LD elements 20, which increases degradation of the LD elements 20. For this reason, an excessive decrease in the Vf value obtained by the second measuring step is determined to be defective. For example, the Vf value of 3.6 or less, or 4.1 or greater is determined to be defective. When a nitride semiconductor is used in the LD element 20 and the space S is not sufficiently hermetically sealed, dust may be attracted to the LD elements 20 in the step of supplying electric current for a certain length of time or longer, which may result in difference in the FFP obtained by the first measuring step and the FFP obtained by the second measuring step. For example, the peak of the FFP obtained by the second measuring step shifts from the peak of the FFP obtained by the first measuring step. When the optical output is measured, for example, an optical output of 2.2 W or less, or 2.75 W or greater is determined to be defective. Further, when the wavelength is measured, and a desired peak wavelength of the LD elements 20 is 450 nm, a wavelength of 445 nm or shorter, or 455 nm or longer is determined to be defective. Those values are determined to be defective because driving the light emitting device with such a condition may change the optical properties. In the present embodiment, the first property is measured in the first measuring step and the second measuring step. However, when a reference value of the first property used to compare with the value of the first property measured in the second measuring step to determine whether the semiconductor laser element 20 is defective is preliminarily provided, the first measuring step may be omitted. That is, the reference value of the first property is compared with the value of the first property measured in the second measuring step to determine whether the semiconductor laser element 20 is defective. Further, when a reference value of the first property used to compare with the value of the first property measured in the first measuring step to determine whether the semiconductor laser element 20 is defective is preliminarily provided, the step of supplying electric current for a certain length of time or longer and the second measuring step may be omitted. That is, when the values of the first property measured in the first measuring step can be evaluated without inspection of time-depending change, the step of supplying electric current for a certain length of time or longer and the second measuring step may be omitted. In this case, the reference value of the first property is compared with the value of the first property measured in the first measuring step to determine whether the semiconductor laser element 20 is defective.

In this case, deviation in the properties obtained by the measuring is classified into a plurality of ranks. Accordingly, uniformity of properties of the LD elements 20 can be enhanced. For example, the VF values of the LD elements 20 are classified in ranks. The light emitting device(s) having the LD element(s) 20 that does not meet a predetermined range of ranks is determined to be defective. However, the quality may be determined without creating ranks.

Fixing Second Light-Transmissive Part 90 and Cover 100

Next, a second light-transmissive part 90 is disposed on the upper surface of the base cap 30 to cover the upper-end of the through-opening of the support 31. The second light-transmissive part 90 serves as a lens configured to refract the laser light from each of the LD elements 20 such that the laser light from each of the LD element is irradiated on the lower surface of the fluorescent part 111. Examples of the material of the second light-transmissive part 90 include optical glasses such as BK7, and light-transmissive resins. The second light-transmissive part 90 can have a thickness in a range of, for example, 1 mm to 5 mm.

Subsequently, a cover 100 defining an opening is fixed on the upper surface of the second frame 13. An optical component 110 is disposed to cover the opening of the cover 100. The second light-shielding part 120 is disposed between the lateral surfaces of the optical component 110 and the cover 100 to shield the light from the optical component 110. The cover 100 has a lateral part widening downward. This configuration increases the volume that allows dissipation of heat, and accordingly, heat generated in the optical component 110 can be dissipated efficiently.

The optical component 110 includes a fluorescent part 111, a first light-shielding part 112 disposed on the lateral surfaces of the fluorescent part 111, a dielectric multilayer film 113 disposed on the lower surface of the fluorescent part 111, a thermally-conducting member 114 disposed on the lower surface of the dielectric multilayer film 113, and an anti-reflecting filter 115 disposed on the lower surface of the thermally-conducting member 114. Disposing the thermally-conducting member 114 at location directly under the fluorescent part 111 via the dielectric multilayer film 113 that is configured to reflect fluorescent light can facilitate extraction of the fluorescent light while dissipating the heat generated by the fluorescent part 111. The fluorescent part 111 contains one or more fluorescent materials. For example, at least one fluorescent material among YAG phosphors, LAG phosphors, and Ca-α sialon phosphors can be contained. For the first light-shielding part, light-shielding ceramics such as alumina can be used. For the thermally-conducting member 114, for example, sapphire, SiC, or the like can be used.

When seen from above, the second light-shielding part 120 is arranged surrounding the optical component 110. As shown in FIG. 2, the second light-shielding part 120 is disposed to cover entire lateral surfaces of the heat conducting part 114. With this arrangement, lateral transmission of light from the thermally-conducting member 114 can be prevented or reduced. For the second light-shielding part 120, for example, a resin material added with light scattering particles such as titanium oxide can be used.

In the present embodiment, the optical properties are measured by the first measuring step and the second measuring step, and therefore, the second light-transmissive part 90 and the cover 100 are fixed to the base cap 30 and the base 10 after the second measuring step. This facilitates accurate evaluation of the first property of each of the LD elements 20. Moreover, the cover 100 and some other components are fixed after evaluating the measuring results, which prevents components such as the cover 100 to be wasted. When only the electrical properties are measured in the first measuring step and the second measuring step, the fixing of the second light-transmissive part 90 and the cover 100 to the base cap 30 and the base 10 can be performed before performing the first measuring step. In other words, providing the light emitting device 200C in the step of providing a light emitting device and then the first measuring step may be performed.

The second wires 82 may be disconnected by supplying electric current that is equal to or greater than a certain amount to the second wires 82 after the second measuring step. When a connection is in series, an external terminal is connected to the first wiring 11a, but if the external terminal is connected to both the first wiring 11a and the second wiring 11b due to a positional deviation of the external terminal, uniform supply of the current to the first LD element 20a and the second LD element 20b may be impeded, which may result in uneven emission from all the LD elements 20 that are connected in series. Whereas, disconnecting the second wires 82 can prevent flow of current to the second LD elements 20b when the external terminal is unintentionally connected to the second wiring 11b, which can facilitate supplying of electric current more uniformly. For example, when the second wires 82 are made of Au and have a diameter of 60 μm, the second wires 82 can be disconnected by supplying an electric current of about 7.8 A to a single second wire 82.

The light emitting devices according to the embodiments can be used for vehicular lightings etc.

It is to be understood that, although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A method of manufacturing a light emitting device, the method comprising, in this order:
   providing the light emitting device, which comprises:
      a base comprising a first wiring, a second wiring, and a third wiring,
      a first semiconductor laser element electrically connected to the first wiring and the second wiring, at an upper surface side of the base, and
      a second semiconductor laser element electrically connected to the second wiring and the third wiring, at the upper surface side of the base,
      wherein the base comprises a frame surrounding the first semiconductor laser and the second semiconductor laser in a top view,
      wherein the first wiring comprises:
         a first part that is located at an upper surface of the base at a location inward of the frame, and
         a second part that is exposed at a location outward of the frame in the top view, and
      wherein the first semiconductor laser element and the second semiconductor laser element are connected in series;
   performing a first measurement, which comprises:
      supplying electric current to the first semiconductor laser element through the first and second parts of the first wiring and through the second wiring to measure at least one property of the first semiconductor laser element, the at least one property of the first semiconductor laser element including at least one of an electrical property or an optical property, and
      supplying electric current to the second semiconductor laser element through the second wiring and the third wiring to measure at least one property of the second semiconductor laser element, the at least one property of the second semiconductor laser element including at least one of an electrical property or an optical property;
   supplying electric current to both the first semiconductor laser element and the second semiconductor laser element through the first and second parts of the first wiring for a length of time;
   performing a second measurement, which comprises:
      supplying electric current to the first semiconductor laser element through the first and second parts of the first wiring and through the second wiring to measure said at least one property of the first semiconductor laser element, and supplying electric current to the second semiconductor laser element through the second wiring and the third wiring to measure said at least one property of the second semiconductor laser element; and evaluating the first semiconductor laser element based on said at least one property of the first semiconductor laser element measured during the first measurement and the second measurement, and evaluating the second semiconductor laser element based on said at least one property of the second semiconductor laser element measured during the first measurement and the second measurement.

2. The method of manufacturing a light emitting device according to claim 1, wherein the at least one property of the first semiconductor laser element includes a forward voltage of the first semiconductor laser element, and the at least one property of the second semiconductor laser element includes a forward voltage of the second semiconductor laser element.

3. The method of manufacturing a light emitting device according to claim 1, wherein:
each of the first semiconductor laser element and the second semiconductor laser element comprises a nitride semiconductor, and
the method further comprises, between the step of providing the light emitting device and the step of performing the first measurement, fixing a cap to the base to create a hermetically sealed space in which the first semiconductor laser element and the second semiconductor laser element are located.

4. The method of manufacturing a light emitting device according to claim 1, wherein the at least one property of the first semiconductor laser element includes a far field pattern of the first semiconductor laser element, and the at least one property of the second semiconductor laser element includes a far field pattern of the second semiconductor laser element.

5. The method of manufacturing a light emitting device according to claim 1, wherein in the step of supplying electric current for a length of time, the electric current is supplied to the first semiconductor laser element and the second semiconductor laser element connected in series.

6. The method of manufacturing a light emitting device according to claim 1, wherein the step of providing the light emitting device comprises:
providing a first laser device comprising the first semiconductor laser element mounted on a first sub-mount, and
providing a second laser device comprising the second semiconductor laser element mounted on a second sub-mount,
simultaneously bonding the first laser device and the second laser device to the base via a bonding material by heating the bonding material without pressing the first laser device and the second laser device, the bonding material containing metal nanoparticles or metal sub-micron particles and an organic solvent.

7. The method of manufacturing a light emitting device according to claim 1, wherein:
the light emitting device further comprises a sub-mount disposed between the second semiconductor laser element and the second wiring, and
the second wiring and the sub-mount are connected to each other by a wire.

8. The method of manufacturing a light emitting device according to claim 7, further comprising, after performing the second measurement, disconnecting the wire connecting the second wiring and the sub-mount by supplying electric current that is equal to or greater than a certain amount to the wire.

9. The method of manufacturing a light emitting device according to claim 1, wherein the first semiconductor laser element is inspected before being electrically connected to the first wiring and the second wiring, and the second semiconductor laser element is inspected before being electrically connected to the second wiring and the third wiring.

10. The method of manufacturing a light emitting device according to claim 1, wherein, in the step of performing the first measurement, a value of the electric current is gradually increased.

11. A method of manufacturing a light emitting device, the method comprising, in this order:
providing the light emitting device, which comprises:
a base comprising a first wiring, a second wiring, and a third wiring,
a first semiconductor laser element electrically connected to the first wiring and the second wiring, at an upper surface side of the base, and
a second semiconductor laser element electrically connected to the second wiring and the third wiring, at the upper surface side of the base,
wherein the base comprises a frame surrounding the first semiconductor laser and the second semiconductor laser in a top view,
wherein the first wiring comprises:
a first part that is located at an upper surface of the base at a location inward of the frame, and
a second part that is exposed at a location outward of the frame in the top view, and
wherein the first semiconductor laser element and the second semiconductor laser element are connected in series;
performing a first measurement, which comprises:
supplying electric current to the first semiconductor laser element through the first and second parts of the first wiring and through the second wiring to measure at least one property of the first semiconductor laser element, the at least one property of the first semiconductor laser element including at least one of an electrical property or an optical property, and
supplying electric current to the second semiconductor laser element through the second wiring and the third wiring to measure at least one property of the second semiconductor laser element, the at least one property of the second semiconductor laser element including at least one of an electrical property or an optical property;
evaluating the first semiconductor laser element based on said at least one property of the first semiconductor laser element measured during the first measurement, and evaluating the second semiconductor laser element based on said at least one property of the second semiconductor laser element measured during the first measurement; and
supplying electric current to both the first semiconductor laser element and the second semiconductor laser element through the first and second parts of the first wiring for a length of time.

12. A method of manufacturing a light emitting device, the method comprising, in this order:
   providing the light emitting device, which comprises:
      a base comprising a first wiring, a second wiring, and a third wiring,
      a first semiconductor laser element electrically connected to the first wiring and the second wiring, at an upper surface side of the base,
      a second semiconductor laser element electrically connected to the second wiring and the third wiring, at the upper surface side of the base, and
      a sub-mount disposed between the second semiconductor laser element and the second wiring,
      wherein the first semiconductor laser element and the second semiconductor laser element are connected in series, and
      wherein the second wiring and the sub-mount are connected to each other by a wire;
   performing a first measurement, which comprises:
      supplying electric current to the first semiconductor laser element through the first wiring and the second wiring to measure at least one property of the first semiconductor laser element, the at least one property of the first semiconductor laser element including at least one of an electrical property or an optical property, and
      supplying electric current to the second semiconductor laser element through the second wiring and the third wiring to measure at least one property of the second semiconductor laser element, the at least one property of the second semiconductor laser element including at least one of an electrical property or an optical property;
   evaluating the first semiconductor laser element based on said at least one property of the first semiconductor laser element measured during the first measurement, and evaluating the second semiconductor laser element based on said at least one property of the second semiconductor laser element measured during the first measurement; and
   disconnecting the wire connecting the second wiring and the sub-mount by supplying electric current that is equal to or greater than a certain amount to the wire.

13. The method of manufacturing a light emitting device according to claim 12, further comprising, after evaluating the first semiconductor laser element:
   supplying electric current to the first semiconductor laser element and the second semiconductor laser element for a length of time;
   performing a second measurement, which comprises:
      supplying electric current to the first semiconductor laser element through the first wiring and the second wiring to measure said at least one property of the first semiconductor laser element, and
      supplying electric current to the second semiconductor laser element through the second wiring and the third wiring to measure said at least one property of the second semiconductor laser element; and
   evaluating the first semiconductor laser element based on said at least one property of the first semiconductor laser element measured during the first measurement and the second measurement, and evaluating the second semiconductor laser element based on said at least one property of the second semiconductor laser element measured during the first measurement and the second measurement
   wherein disconnecting the wire connecting the second wiring and the sub-mount is performed after performing the second measurement.

* * * * *